United States Patent
Lai et al.

(10) Patent No.: US 10,540,046 B2
(45) Date of Patent: Jan. 21, 2020

(54) MICRO LED TOUCH DISPLAY PANEL

(71) Applicant: HON HAI PRECISION INDUSTRY CO., LTD., New Taipei (TW)

(72) Inventors: Chung-Wen Lai, New Taipei (TW); Wei-Chih Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/018,163

(22) Filed: Jun. 26, 2018

(65) Prior Publication Data

US 2019/0012012 A1   Jan. 10, 2019

Related U.S. Application Data

(60) Provisional application No. 62/529,541, filed on Jul. 7, 2017.

(51) Int. Cl.
*G06F 3/044* (2006.01)
*G09G 3/32* (2016.01)
*H01L 33/36* (2010.01)

(52) U.S. Cl.
CPC .............. *G06F 3/044* (2013.01); *G09G 3/32* (2013.01); *H01L 33/36* (2013.01); *G02F 2201/121* (2013.01)

(58) Field of Classification Search
CPC .......... G06F 3/044; G06F 3/0412; G09G 3/32
See application file for complete search history.

(56) References Cited

U.S. PATENT DOCUMENTS

| | | | |
|---|---|---|---|
| 2016/0343771 A1* | 11/2016 | Bower | H01L 21/77 |
| 2016/0372514 A1 | 12/2016 | Chang et al. | |
| 2017/0068362 A1* | 3/2017 | Den Boer | G06F 3/0412 |
| 2017/0102797 A1* | 4/2017 | Cok | G06F 3/0412 |
| 2017/0108983 A1* | 4/2017 | Chen | G06F 3/0416 |
| 2017/0115775 A1* | 4/2017 | Wu | G02F 1/13454 |
| 2017/0269749 A1* | 9/2017 | Bok | G02F 1/13338 |
| 2017/0277315 A1* | 9/2017 | Wu | G06F 3/0412 |
| 2018/0284934 A1* | 10/2018 | Wu | G09G 3/20 |
| 2019/0012957 A1* | 1/2019 | Liu | H01L 25/0753 |

FOREIGN PATENT DOCUMENTS

| | | |
|---|---|---|
| TW | 201701458 A | 1/2017 |
| TW | 201723777 A | 7/2017 |

* cited by examiner

*Primary Examiner* — Priyank J Shah
(74) *Attorney, Agent, or Firm* — ScienBiziP, P.C.

(57) ABSTRACT

A micro LED touch display pane of reduced thickness includes a substrate, a display driving layer, micro LEDs on the display driving layer, and common electrodes connecting to the micro LEDs. The micro LEDs are spaced apart from each other and coupled to the display driving layer. The common electrodes cover the micro LEDs. The touch display panel further includes first and second electrodes. The common electrodes and the first electrodes are defined in one layer, insulated from the second electrodes. The first electrodes and the second electrodes cooperatively form mutual-capacitance touch sensing structures.

7 Claims, 8 Drawing Sheets

MICRO LED TOUCH DISPLAY PANEL

FIELD

The subject matter herein generally relates to a micro LED touch display panel.

BACKGROUND

A conventional touch display panel generally includes a display panel and a touch panel located on the display panel. Thus, the touch display pane may have a great thickness. Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
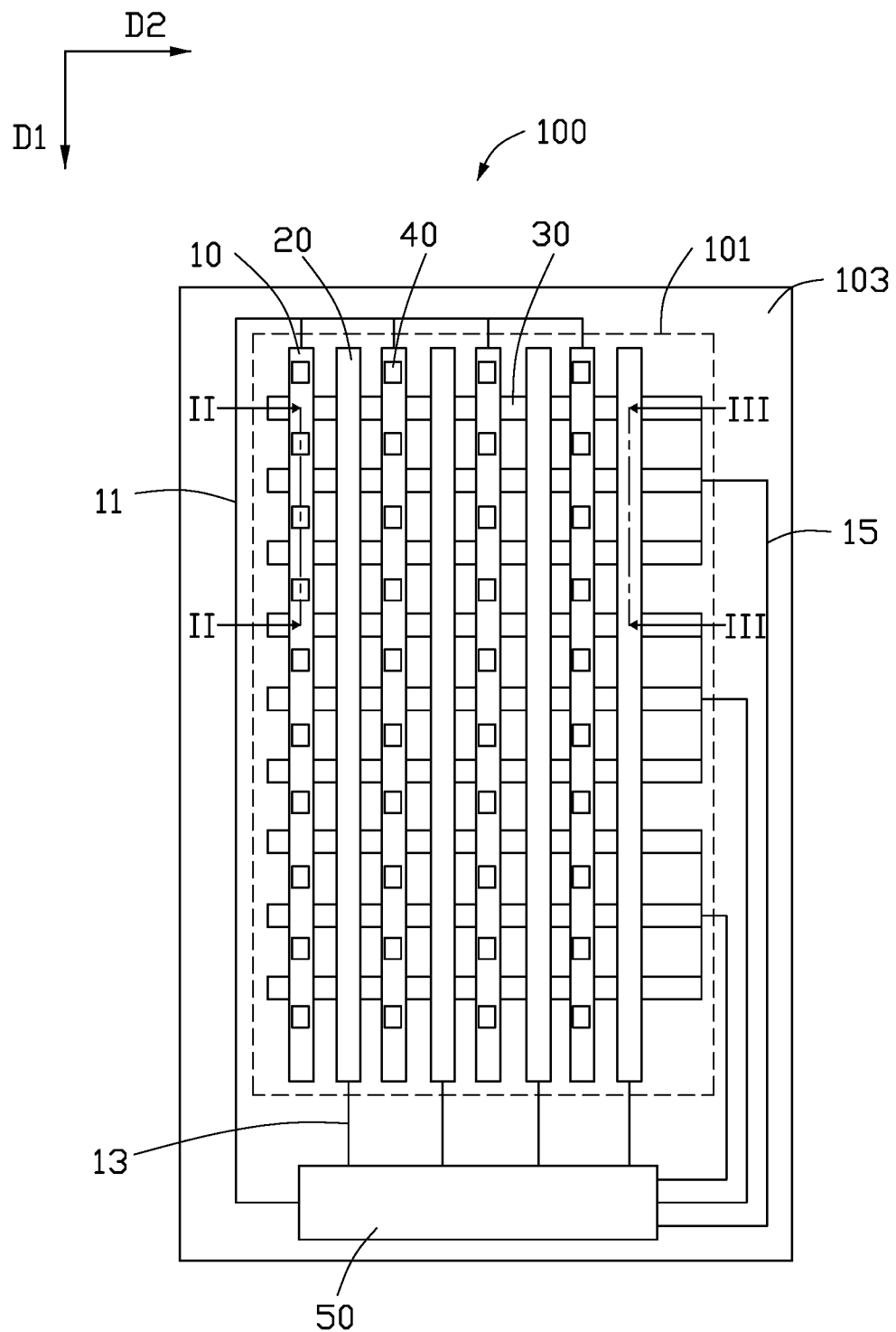
FIG. 1 is a plan view of a first exemplary embodiment of a micro LED touch display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

The term "micro LED" in this disclosure refers to an LED having very small size (e. g. several millimeters, several hundred micrometers, or less than or equal to 100 micrometers).

First Embodiment

FIG. 1 illustrates a micro LED touch display panel 100 according to a first exemplary embodiment. The micro LED touch display panel 100 defines a display area 101 and a non-display area 103 surrounding the display area 101. A plurality of common electrodes 10, a plurality of first electrodes 20, a plurality of second electrodes 30, and a plurality of micro LEDs 40 are located in the display area 101. A driver 50 is located in the non-display area 103. The micro LEDs 40 are configured for emitting light to achieve display.

The common electrodes 10 and the first electrodes 20 are located in same layer and formed by patterning a single conductive layer. In this embodiment, as shown in FIG. 1, each common electrode 10 and each first electrode 20 extend as strips in a first direction D1. The common electrodes 10 and the first electrodes 20 are spaced apart from each other and arranged alternately along a second direction D2. In second direction D2, each common electrode 10 alternates with one first electrode 20. The second direction D2 intersects the first direction D1. In this embodiment, the first direction D1 is substantially perpendicular to the second direction D2. For most of common electrodes 10, each common electrode 10 is located between two adjacent first electrodes 20. The second electrodes 30 and the common electrodes 10 are located in different layers. In this embodiment, the second electrodes 30 are located below the common electrodes 10 and the first electrodes 20. Each second electrode 30 extends as a strip in the second direction D2, and the second electrodes 30 are arranged at intervals in the first direction D1. The second electrodes 30 and the first electrodes 20 are located in different layers. The second electrodes 30 are insulated from and intersect with the first electrodes 20. The first electrodes 20 and the second electrodes 30 cooperatively form a mutual capacitive touch sensing structure. Specifically, the second electrodes 30 are touch driving electrodes, and the first electrodes 20 are touch sensing electrodes. Alternatively, the second electrodes 30 are touch sensing electrodes, and the first electrodes 20 are touch driving electrodes.

As shown in FIG. 1, the micro LEDs 40 are arranged in a matrix to correspond to the common electrodes 10. Each micro LED 40 overlaps with one common electrode 10. Each common electrode 10 serves as an anode or a cathode of several micro LEDs 40. In this embodiment, each common electrode 10 corresponds to and overlaps with a column of micro LEDs 40 extending in the first direction D1, the micro LEDs 40 in the column of micro LEDs 40 being spaced apart from each other. In this embodiment, a projection of any micro LED 40 along a depth direction of the micro LED touch display panel 100 does not overlap with any projection of the second electrode 30 along the depth direction. A projection of each second electrode 30 is located between projections of two adjacent rows (in the second direction D2) of the micro LEDs 40. A projection of each first electrode 20 along the depth direction of the micro LED touch display panel 100 is located between projections of two adjacent columns (in the first direction D1) of the micro LEDs 40 along the depth direction of the micro LED touch display panel 100.

In this embodiment, as shown in FIG. 1, the common electrodes 10 are electrically connected to the driver 50 by a single first connecting line 11. Each first electrode 20 is electrically coupled to the driver 50 by a second connecting line 13. The second electrodes 30 are electrically coupled to the driver 50 by third connecting lines 15. The first connecting line 11, the second connecting lines 13, and the third connecting lines 15 are mainly located in the non-display area 103 and extend to the display area 101 only for coupling with their respective electrodes. In this embodiment, three adjacent second electrodes 30 form a group. Each group of the second electrodes 30 is electrically coupled to the driver 50 by a single third connecting line 15. It can be understood that two or more than three adjacent second electrodes 30 may also form a group, each group being electrically coupled to the driver 50 by a single third connecting line 15. Alternatively, each second electrode is electrically coupled to the driver by an independent connecting line.

Figure 2:
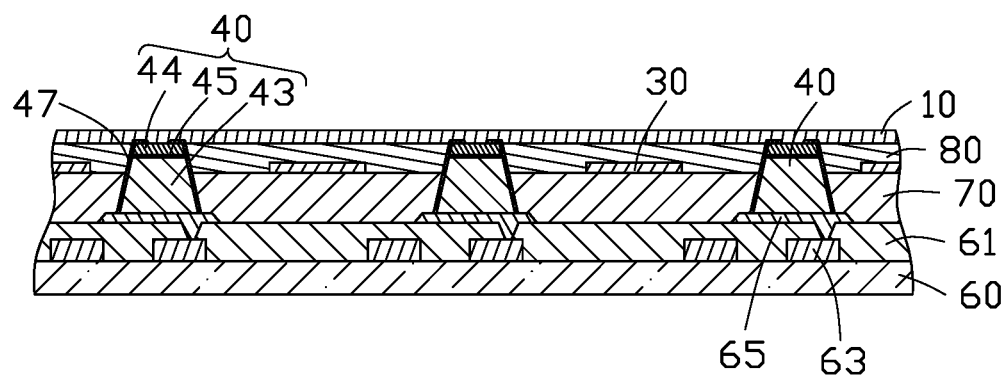
FIG. 2 is a cross-sectional view along line II-II of FIG. 1.

As shown in FIG. 2, the micro LED touch display panel 100 further includes a substrate 60 and a display driving layer 61 formed on the substrate 60. The display driving layer 61 includes thin film transistors 63. The common electrodes 10, the first electrodes 20, the second electrodes 30, and the micro LEDs 40 are located on a side of the display driving layer 61 away from the substrate 60. The micro LEDs 40 are located on the display driving layer 61. A side of each micro LED 40 adjacent to the display driving layer 61 is covered by a contact electrode 65 and a side of each micro LED 40 away from the display driving layer 61 is covered by one common electrode 10. The common electrode 10 and the contact electrode 65 serve as anode and cathode of the micro LED 40. When the contact electrode 65 and the common electrode 10 are fed with different voltages to generate a voltage difference, the micro LED 40 will emit light. Each contact electrode 65 is located between one micro LED 40 and the display driving layer 61. Each contact electrode 65 is electrically coupled to one thin film transistor 63 in the display driving layer 61. The thin film transistor 63 is configured to supply a voltage to the contact electrode 65. The contact electrodes 65 may be formed by patterning a single conductive layer.

As shown in FIG. 2, a first insulating layer 70 and a second insulating layer 80 are stacked on the side of the display driving layer 61 away from the substrate 60. The first insulating layer 70 is located on the display driving layer 61 and covers the contact electrodes 65 of the micro LEDs 40. The second insulating layer 80 is located on a side of the first insulating layer 70 away from the display driving layer 61. The micro LEDs 40 are embedded in the first insulating layer 70 and the second insulating layer 80 and are exposed from the second insulating layer 80. As shown in FIG. 2, the second electrodes 30 are located between the first insulating layer 70 and the second insulating layer 80.

As shown in FIG. 2, each common electrode 10 is located on a side of the second insulating layer 80 away from the first insulating layer 70, and each common electrode 10 directly contacts and covers several micro LEDs 40. As shown in FIG. 1 and FIG. 2, in this embodiment, each second electrode 30 is located between adjacent rows of micro LEDs 40 along the second direction D2.

Figure 3:
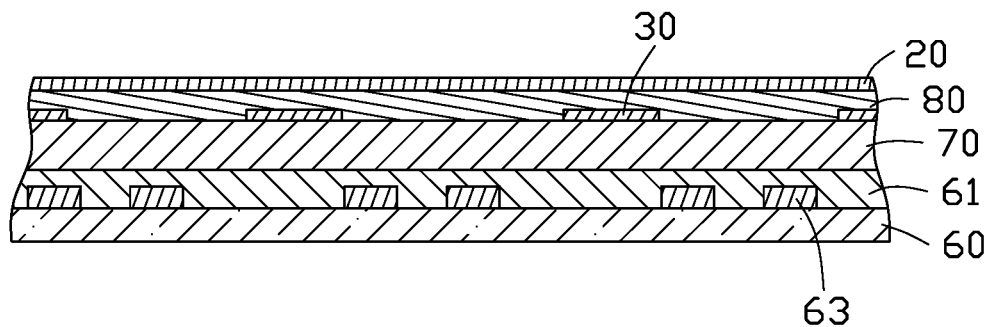
FIG. 3 is a cross-sectional view along line III-III of FIG. 1.

Referring to FIG. 3, each first electrode 20 is located on the side of the second insulating layer 80 away from the first insulating layer 70. The common electrodes 10 and the first electrodes 20 are located in the same layer and are formed by patterning a single conductive layer.

Each micro LED 40 may be a conventional micro LED 40. Specifically, each micro LED 40 may include a P-type doped light-emitting material layer 41, an N-type doped light-emitting material layer 43, and an active layer 45 between the P-type doped light-emitting material layer 41 and the N-type doped light-emitting material layer 43, as shown in FIG. 2. In this embodiment, the P-type doped light-emitting material layer 41 is coupled to the common electrode 10, and the N-type doped light-emitting material layer 43 is coupled to the contact electrode 65.

It can be understood that, as shown in FIG. 2, an outer surface of each micro LED 40 is further covered by a dielectric layer 47 to protect and insulate the micro LED 40. In this embodiment, the dielectric layer 47 covers a side wall of the micro LED 40 that is in contact with the first insulating layer 70 and the second insulating layer 80, and also partially covers a top surface of the micro LED 40 away from the substrate 60.

One or other of the first insulating layer 70 and the second insulating layer 80 is made of a light absorbing material, for example, a black matrix resin.

The substrate 60 may be made of glass, or high-strength plastic, such as Polycarbonate (PC), Polyethylene terephthalate (PET), and Polymethylmethacrylate (PMMA), Cyclic Olefin Copolymer (COC) or Polyether sulfone (PES) and other materials. The thin film transistor 63 is a thin film transistor conventionally used in the art, and specifically may include a gate electrode (not shown), a semiconductor layer (not shown), a source electrode (not shown), and a drain electrode (not shown) coupled to opposite sides of the semiconductor layer. The thin film transistors 63 in the display driving layer 61 include two types, namely driving thin film transistors 63 and switching thin film transistors 63. The driving thin film transistor 63 outputs electrical current to the micro LED 40 and is electrically coupled to the contact electrode 65 of the micro LED 40. The switching thin film transistor 63 controls on and off of the driving thin film transistor 63, which is electrically coupled to a scan line (not shown) and a data line (not shown).

Second Embodiment

Figure 4:
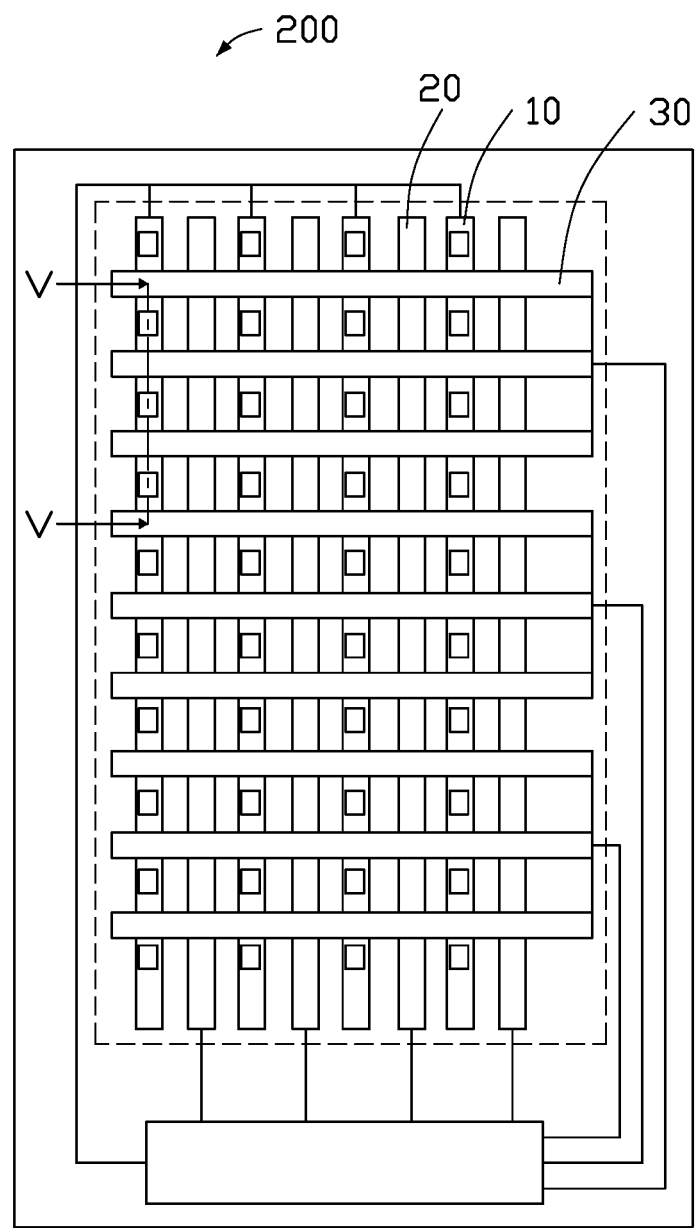
FIG. 4 is a plan view of a second exemplary embodiment of a micro LED touch display panel.
Figure 5:
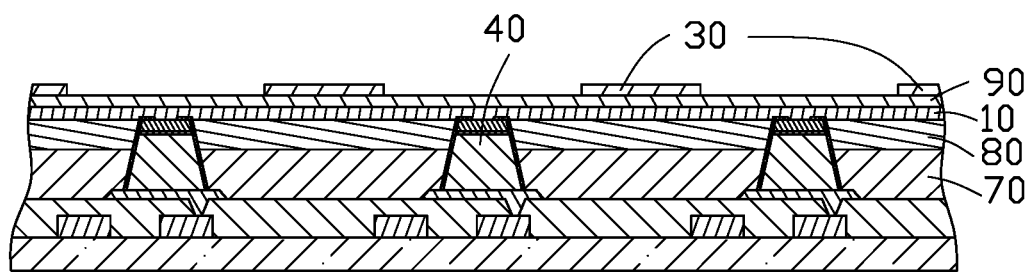
FIG. 5 is a cross-sectional view along line V-V of FIG. 4.

FIG. 4 and FIG. 5 illustrate a micro LED touch display panel 200 according to a second exemplary embodiment. The micro LED touch display panel 200 is substantially the same as the micro LED touch display panel 100 of the first embodiment except that the positions of the second electrodes 30 are changed. In this embodiment, the second electrodes 30 are located above the common electrodes 10 and the first electrodes 20 and a third insulating layer is located on a side of the second insulating layer 80 away from the first insulating layer 70. The third insulating layer 90 covers the common electrodes 10 and the first electrodes 20. The second electrodes 30 are located on a side of the third insulating layer 90 away from the first insulating layer 70. However, in the first embodiment, the second electrodes 30 are located below the common electrodes 10 and the first electrodes 20, and are between the first insulating layer 70 and the second insulating layer 80.

As shown in FIG. 5, the third insulating layer 90 electrically insulates the second electrodes 30 from the common electrodes 10 and the first electrodes 20.

Since the second electrodes 30 are not located between the first insulating layer 70 and the second insulating layer 80, in the present embodiment the first insulating layer 70 and the second insulating layer 80 may be replaced by a single insulating layer.

In the first embodiment and the second embodiment, since the common electrodes 10 are spaced apart from the first electrodes 20, the micro LED touch display panel can simultaneously perform display driving and touch driving in one frame of time. In addition, since the common electrode 10 and the first electrode 20 are located in same layer, the thickness of the micro LED touch display panel is reduced.

In the first embodiment and the second embodiment, display driving and touch sensing driving of the micro LED touch display panels 100, 200 can be performed at a same time. The common electrode 10 and the contact electrodes 65 are fed with different voltages to make the micro LED 40 emit light to realize display and the second or first electrodes 30 or 20 are given a touch driving voltage signal. The second or first electrodes 30 or 20 generate signals and transmit the signals to the driver 50.

Third Embodiment

Figure 6:
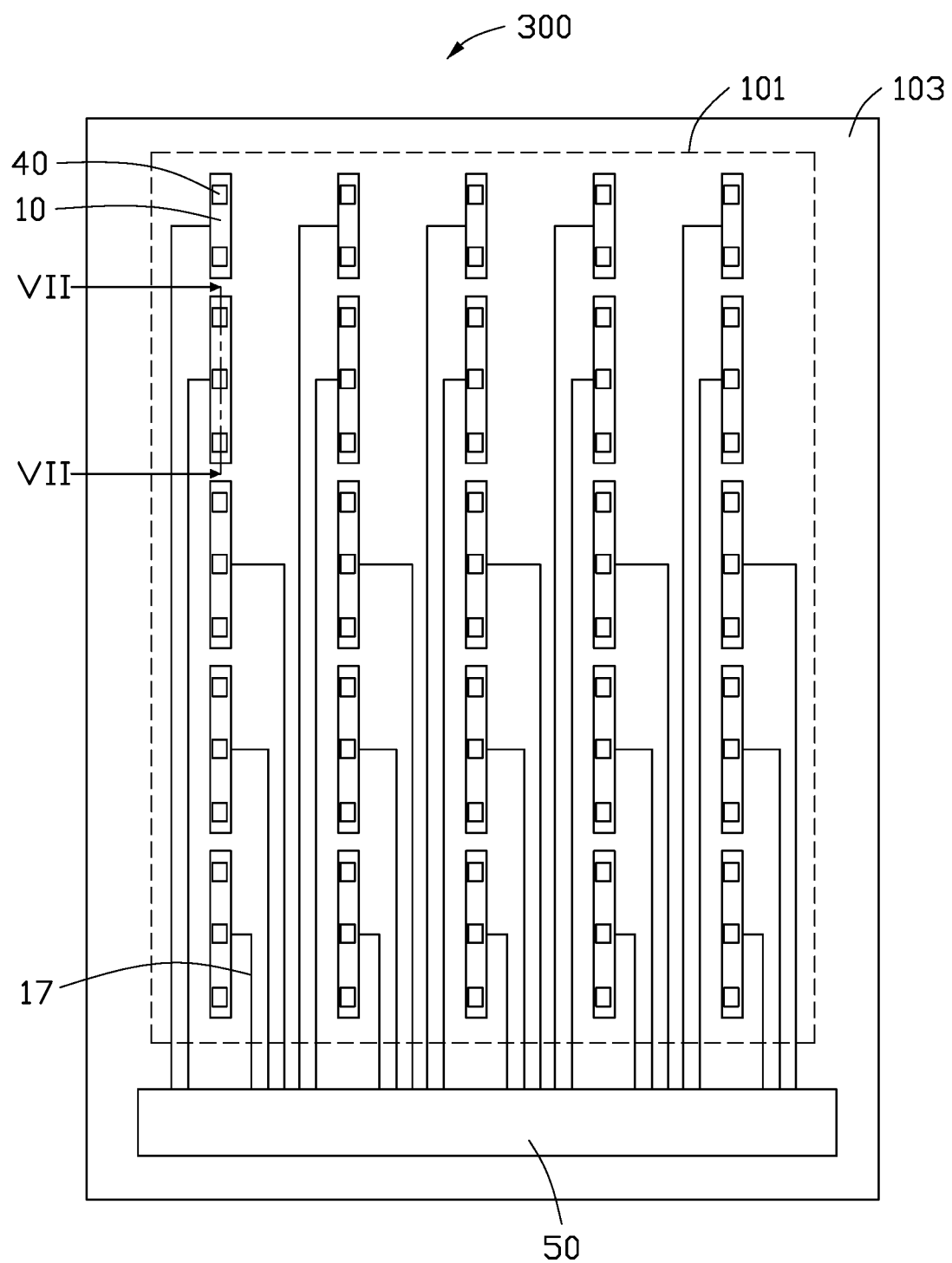
FIG. 6 is a plan view of a third exemplary embodiment of a micro LED touch display panel.
Figure 7:
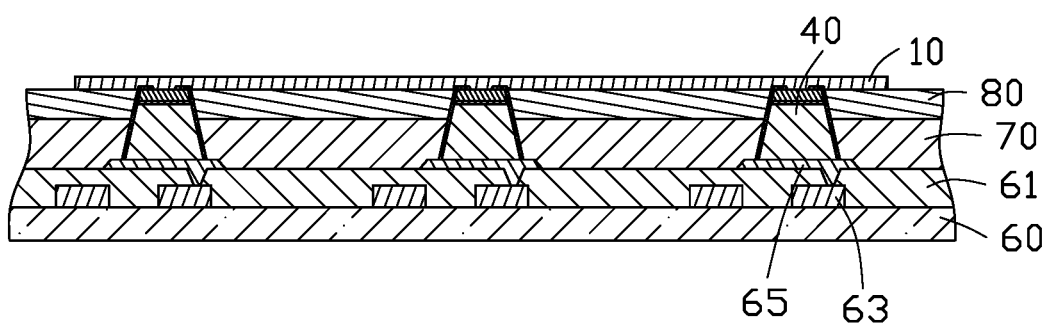
FIG. 7 is a cross-sectional view along line VII-VII of FIG. 6.

FIG. 6 and FIG. 7 illustrate a micro LED touch display panel 300 according to a third exemplary embodiment. The micro LED touch display panel 300 defines a display area 101 and a non-display area 103 surrounding the display area 101. A plurality of common electrodes 10, a plurality of first electrodes 20, a plurality of second electrodes 20, and a plurality of micro LEDs 40 are located in the display area 101. A driver 50 is located in the non-display area 103. The micro LEDs 40 are arranged in a matrix. The common electrodes 10 are spaced apart from each other and arranged in a matrix.

As shown in FIG. 6, the micro LEDs 40 are arranged in a matrix, and the micros LEDs 40 are disposed to correspond to the common electrodes 10. Each common electrode 10 serves as an anode of at least one micro LED 40. In this embodiment, each common electrode 10 corresponds to and overlaps with at least two micro LEDs 40 arranged in the first direction D1. As shown in FIG. 6, each common electrode 10 is electrically coupled to the driver 50 independently by a connecting line 17.

As shown in FIG. 7, the micro LED touch display panel 300 further includes a substrate 60 and a display driving layer 61 formed on the substrate 60. The display driving layer 61 includes a plurality of thin film transistors 63. The common electrodes 10 and the micro LEDs 40 are located on a side of the display driving layer 61 away from the substrate 60. The micro LEDs 40 are located on the display driving layer 61. A contact electrode 65 is provided on a side of each micro LED 40 adjacent to the display driving layer 61 and a common electrode 10 is provided on a side of each micro LED 40 away from the display driving layer 61. The common electrode 10 and the contact electrode 65 serve as an anode and a cathode of the micro LED 40. When the common electrode 10 and the contact electrode 65 are fed with different voltages the micro LED 40 will emit light. Each contact electrode 65 is disposed between one micro LED 40 and the display driving layer 61, and each contact electrode 65 is electrically coupled to one thin film transistor 63 in the display driving layer 61. The contact electrodes 65 may be formed by patterning a single conductive layer.

As shown in FIG. 7, a first insulating layer 70 and a second insulating layer 80 are stacked on the side of the display driving layer 61 away from the substrate 60. The first insulating layer 70 is located on the display driving layer 61 and covers the contact electrodes 65 of the micro LEDs 40. The second insulating layer 80 is located on a side of the first insulating layer 70 away from the display driving layer 61. The micro LEDs 40 are embedded in the first insulating layer 70 and the second insulating layer 80 and are exposed from the second insulating layer 80. As shown in FIG. 7, each common electrode 10 is located on a side of the second insulating layer 80 away from the first insulating layer 70 and each common electrode 10 covers at least two micro LEDs 40.

Figure 8:
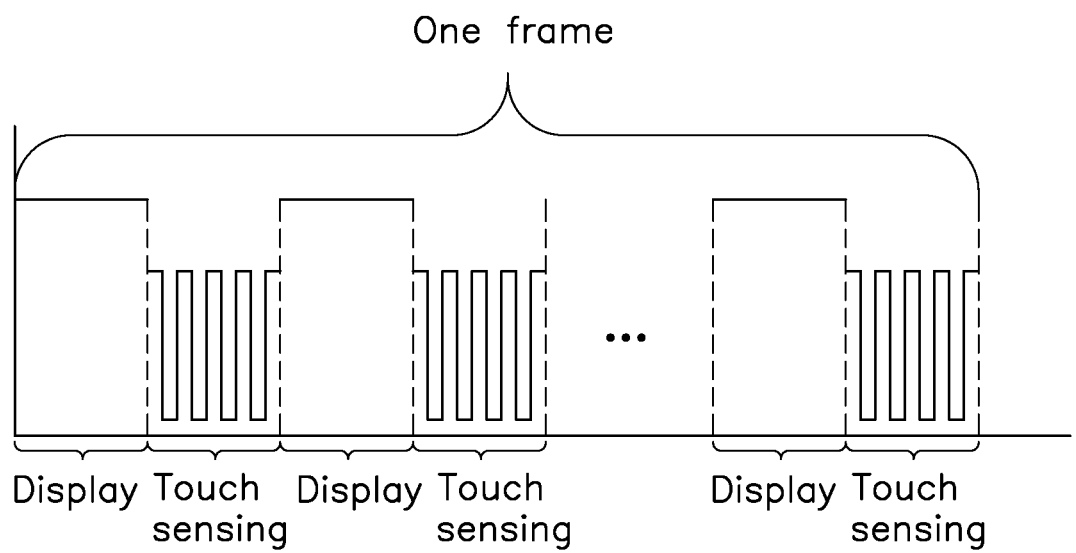
FIG. 8 is a diagram of driving waveforms of the micro LED touch display panel of FIG. 6.

Each common electrode 10 also functions as self-capacitive touch sensing electrode. In this embodiment, the display driving and the touch sensing driving of the micro LED touch display panel 300 need to be performed in time divisions. The micro LED touch display panel can perform display driving and then touch driving alternately in one frame time. As shown in FIG. 8, each frame time is divided into display periods and touch sensing periods, the display periods are alternated with the touch sensing periods. During each display period, each common electrode 10 is applied with a direct current voltage signal; and during each touch sensing period, each common electrode 10 is applied with an alternating current voltage signal.

As the micro LED touch display panel 300 is provided with common electrode 10, the thickness of the micro LED touch display panel 300 is further reduced.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A micro LED touch display panel, comprising:
   a substrate;
   a display driving layer on the substrate;
   a plurality of micro LEDs on the display driving layer, the plurality of micro LEDs being spaced apart from each other and coupled to the display driving layer; and
   a plurality of common electrodes located at a side of the plurality of micro LEDs away from the substrate, the plurality of common electrodes covering the plurality of micro LEDs;
   wherein the micro LED touch display panel further comprises a plurality of first electrodes and a plurality of second electrodes; the plurality of common electrodes and the plurality of first electrodes are located at a same layer and defined by a single conductive layer; the plurality of first electrodes are electrically insulated from and intersect with the plurality of second electrodes; the plurality of first electrodes and the plurality of second electrodes cooperatively form a mutual-capacitance touch sensing structure;
   wherein each of the plurality of first electrodes extends to be a strip in a first direction; each of the plurality of second electrodes extends to be a strip in a second direction intersecting with first direction; the plurality of first electrodes intersect with the plurality of second electrodes;
   wherein each of the plurality of common electrodes extends to be a strip in a first direction; the plurality of common electrodes and the plurality of first electrodes are alternately arranged along the second direction.

2. The micro LED touch display panel of claim 1, further comprising an insulating layer on a side of the display driving layer away from the substrate, wherein the plurality of micro LEDs are embedded in the insulating layer.

3. The micro LED touch display device of claim 2, wherein the insulating layer comprises a first insulating layer on a side of the display driving layer away from the substrate and a second insulating layer on a side of the first insulating layer away from the substrate; and the plurality of second electrodes are between the first insulating layer and the second insulating layer.

4. The micro LED touch display device of claim 2, wherein an additional insulating layer is on a side of the insulating layer away from the substrate, and the plurality of second electrodes are located on a side of the additional insulating layer away from the substrate.

5. The micro LED touch display device of claim 1, wherein the plurality of micro LEDs are arranged in a matrix; each of the plurality of common electrodes covers one column of micro LEDs extending in the first direction.

6. The micro LED touch display device of claim 5, wherein each of the plurality of second electrodes is located between two rows of micro LEDs extending in the second direction; each of the plurality of the first electrodes is located between two columns of micro LEDs extending in the first direction.

7. The micro LED touch display device of claim 1, wherein a contact electrode is provided between each of the plurality of micro LEDs and the display driving layer; the contact electrode is coupled to the display driving layer.

* * * * *